United States Patent
Yang (10) Patent No.: US 9,601,444 B2
(45) Date of Patent: Mar. 21, 2017

(54) CABLE MOUNTED MODULARIZED SIGNAL CONDITIONING APPARATUS SYSTEM

(71) Applicant: Tektronix, Inc., Beaverton, OR (US)

(72) Inventor: Kei-Wean C. Yang, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 117 days.

(21) Appl. No.: 14/317,248

(22) Filed: Jun. 27, 2014

(65) Prior Publication Data

US 2015/0243608 A1 Aug. 27, 2015

Related U.S. Application Data

(60) Provisional application No. 61/945,644, filed on Feb. 27, 2014.

(51) Int. Cl.
*H01L 23/60* (2006.01)
*H01P 3/06* (2006.01)

(52) U.S. Cl.
CPC ........... *H01L 23/60* (2013.01); *H01P 3/06* (2013.01); *H01L 2924/0002* (2013.01); *Y10T 29/49123* (2015.01)

(58) Field of Classification Search
CPC ...................................................... H01L 23/60
USPC ............................................................ 361/56
See application file for complete search history.

(56) References Cited

U.S. PATENT DOCUMENTS

| | | | |
|---|---|---|---|
| 3,676,744 A | 7/1972 | Pennypacker | |
| 5,382,932 A * | 1/1995 | Monti | H01P 1/205 333/245 |
| 5,455,548 A | 10/1995 | Grandchamp et al. | |
| 5,926,076 A | 7/1999 | Johnson et al. | |
| 5,945,634 A * | 8/1999 | Shimirak | H01R 9/0509 174/71 C |
| 6,252,391 B1 | 6/2001 | McAllister et al. | |
| 6,876,183 B2 | 4/2005 | Cannon | |
| 7,282,679 B2 | 10/2007 | Reichinger | |
| 8,918,068 B1 * | 12/2014 | Helms | H01L 27/0255 315/291 |

(Continued)

FOREIGN PATENT DOCUMENTS

EP 0102166 A1 3/1984
EP 0220445 A1 5/1987

(Continued)

OTHER PUBLICATIONS

European Search Report for Application No. 14172943.4, dated Oct. 23, 2014, 9 pages.

(Continued)

*Primary Examiner* — Thienvu Tran
*Assistant Examiner* — Kevin J Comber
(74) *Attorney, Agent, or Firm* — Marger Johnson (57) ABSTRACT

A modularized signal conditioning apparatus system includes at least two slots formed in a coaxial cable. The slots are spaced apart so as to not reduce the measuring performance of the coaxial cable. Slots may be at least 40 mills from one another. In an ESD embodiment, within each slot is an ESD protection component, such as a pair of Shottky diodes coupled between the ground shell and the center conductor of the coaxial cable. Methods of producing modularized signal conditioning apparatus system are also described.

18 Claims, 5 Drawing Sheets

(56) References Cited

U.S. PATENT DOCUMENTS

2003/0107382 A1    6/2003    Kreager et al.
2011/0201232 A1    8/2011    Islam
2013/0012063 A1    1/2013    Thomas et al.

FOREIGN PATENT DOCUMENTS

EP        1124288 A1    8/2001
EP        2658029 A1    10/2013
WO      9528750 A1    10/1995

OTHER PUBLICATIONS

European Search Report for Application No. 15156990.2, Jul. 22, 2015, 10 pages, EP Application No. 15156990.2, Munich, Germany.

\* cited by examiner

CABLE MOUNTED MODULARIZED SIGNAL CONDITIONING APPARATUS SYSTEM

CROSS REFERENCE TO RELATED APPLICATION

This application claims benefit of U.S. Provisional Patent application 61/945,644, filed Feb. 27, 2014, entitled MODULARIZED ESD PROTECTOR DESIGN TO INCREASE PROTECTION CAPABILITY WHILE AVOIDING A FREQUENCY DIP PROBLEM, which is incorporated by reference herein.

BACKGROUND

It is important to include Electro-Static Discharge (ESD) protection in circuits or systems that may be vulnerable to damage caused by an ESD event. For example, a test instrument may be damaged if a probe touches a Device Under Test (DUT) having a different relative voltage than the test instrument. The damage is caused by a sudden rush of electrical current or a high voltage difference being discharged. To prevent damage due to ESD, many test systems include some form of ESD protection.

Figure 1:
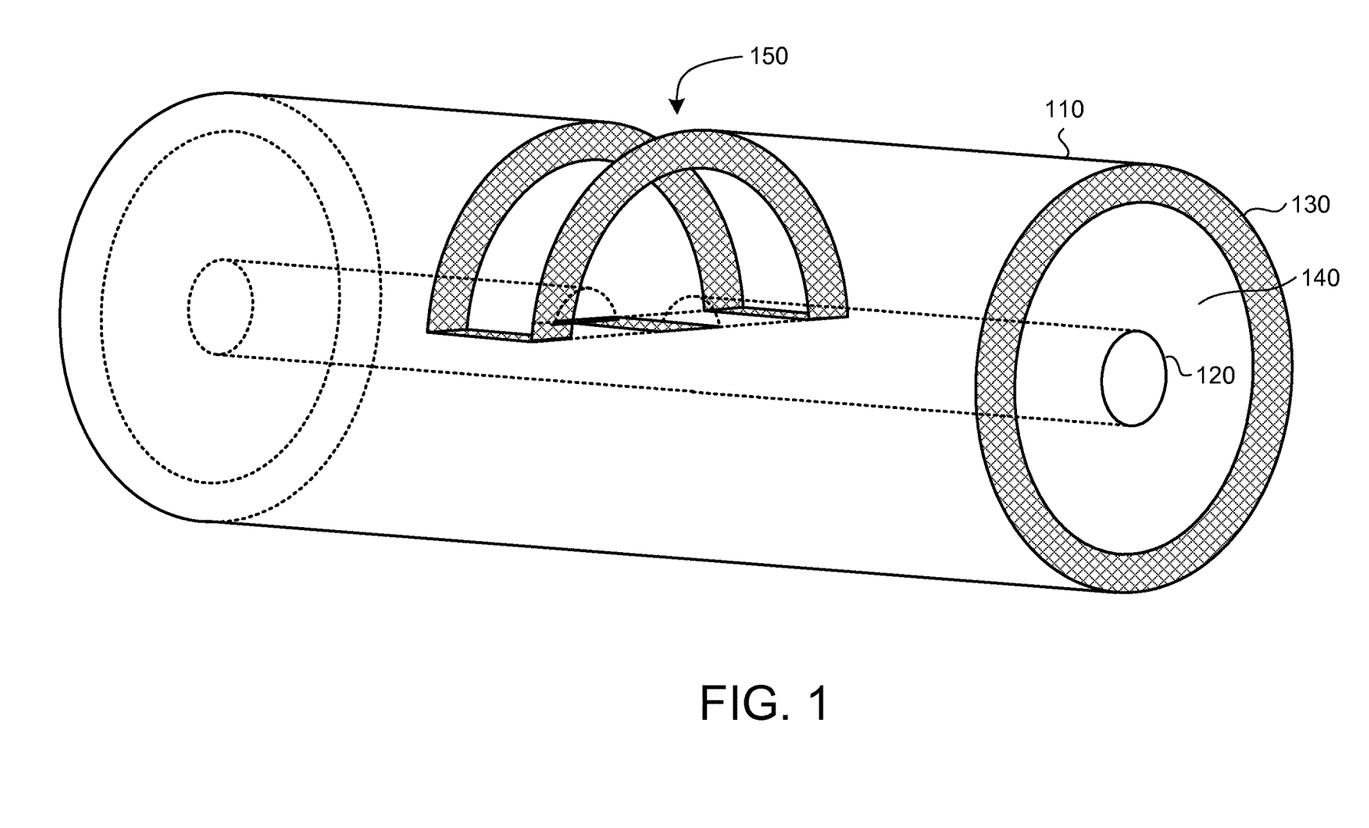
FIG. 1 is a perspective view of a grooved coaxial cable including an example ESD protection circuit.
Figure 2:
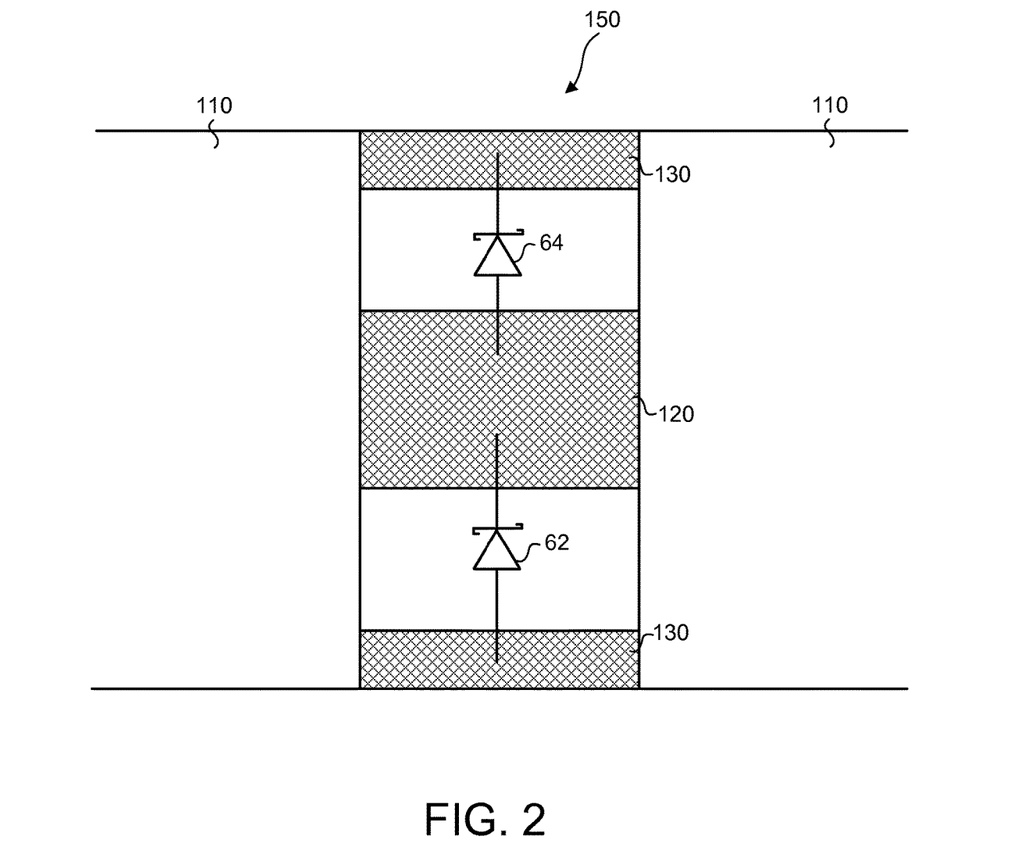
FIG. 2 is a block schematic diagram of the cable illustrated in FIG. 1.

One form of ESD protection is found in a slotted coaxial cable design having a pair of Schottky diodes. FIG. 1 illustrates the general internal structure of such a device. A semi-rigid coaxial cable 110 generally includes a center conductor 120 separated from an electrically conductive ground shell 130 by an insulating material 140. Commonly, the insulating material 140 is formed from Teflon®, in either solid or wound-tape form. A groove or slot 150 is formed in the cable 110 deep enough to expose a portion of the center conductor 120. Then, as illustrated in FIG. 2, a pair of Schottky diodes 62, 64 are coupled between the center conductor 120 and ground shell 130. The Schottky diodes 62, 64 shunt current flow of either polarity during an ESD event, which prevents voltage disparity between components of the system, thereby protecting the components.

Some systems need to shunt more current during an ESD event than the Schottky diodes in FIG. 2 are capable of shunting. To address this, the groove 150 was widened to accommodate additional diodes so that all of the diodes could operate in their safe range. Widening the groove 150, however, reduced the performance of the test system, and specifically reduced the measuring performance at frequencies within the test band. This means that test systems suffer from either inadequate ESD protection or suffer limitations in the highest frequency that they can accurately measure.

Embodiments of the invention address these and other limitations of the prior art.

SUMMARY

The disclosed technology generally pertains to various techniques for incorporating a protection device, such as an ESD protection device, into a semi-rigid high frequency transmission cable system. Specific embodiments include at least two slots formed in a coaxial cable having a center conductor, an insulating material and a ground shell. The first slot and second slot are formed in the coaxial cable at least 40 mils from one another. The first slot houses a first ESD protection sub-circuit while the second slot houses a second ESD protection circuit. Additional slots may accommodate additional ESD protection sub-circuits to adequately protect the system coupled to the coaxial cable.

Methods of forming the device are also disclosed.

DETAILED DESCRIPTION

Embodiments of the disclosed technology generally include techniques for incorporating multiple devices or components into a semi-rigid high frequency transmission cable system for providing signal conditioning. Most of the below examples are described with reference to an ESD embodiment, where current-shunting Shottky diodes are mounted within slots to provide ESD protection, but other components may be mounted within the slots instead of the Shottky diodes to provide different effects. For example, components such as resistors, varistors, varactors or diodes other than Shottky type may be mounted within the slots to have varying effect on the measuring circuit in which embodiments of the invention may be connected to. In this sense embodiments of the invention are directed to a signal conditioning apparatus system in which one or more slots are optimized to produce a predetermined effect on the measuring system to which it is coupled. The optimized slots may then be duplicated in a modular design having adequate spacing between them so that they are electrically independent from one another.

Figure 3:
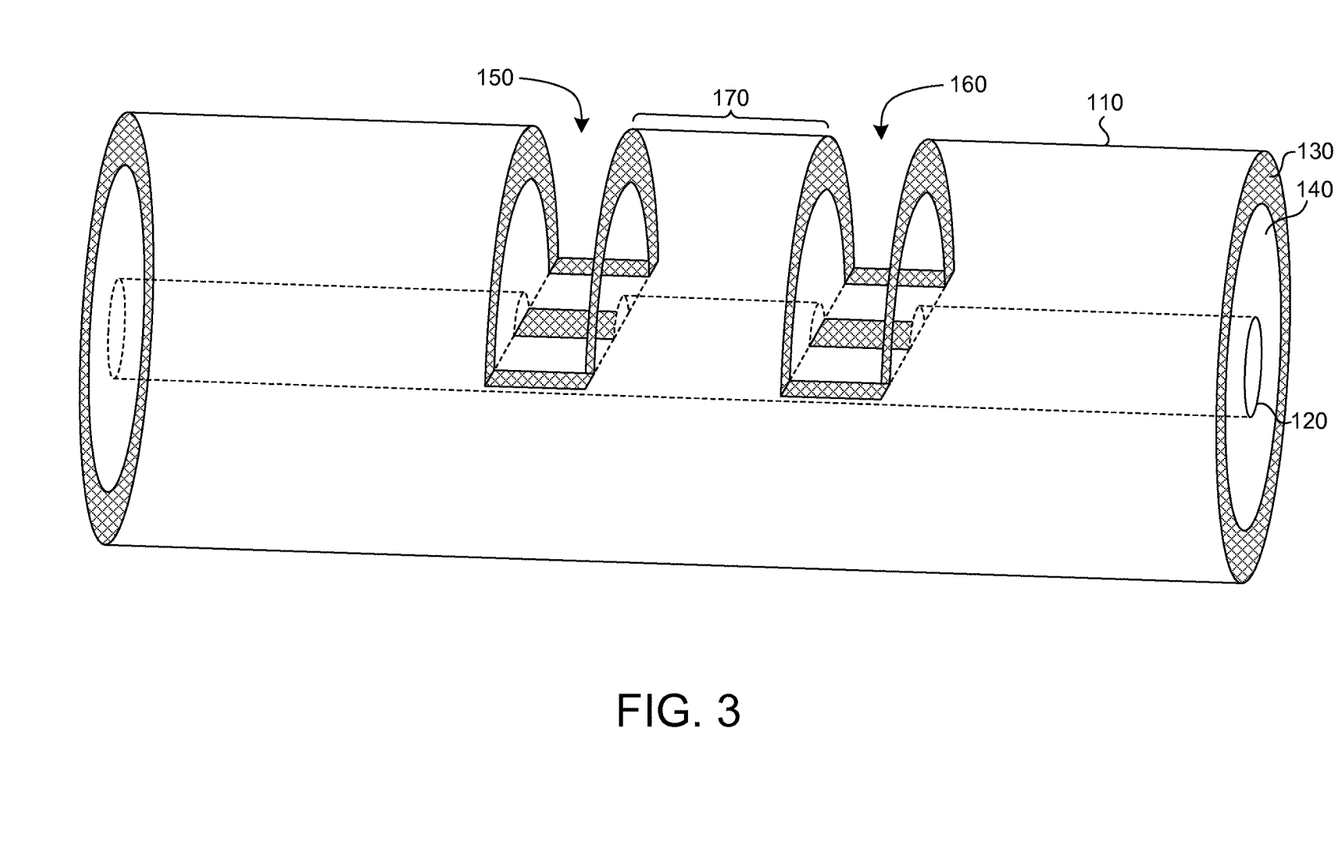
FIG. 3 is a perspective view of a coaxial cable including a modular ESD protection system according to embodiments of the invention.

A slotted cable design, such as illustrated in FIG. 3 uses inductance and capacitance canceling to introduce highly capacitive ESD current shunting Schottky diodes in direct contact with the center cable conductor without introducing significant impedance disturbance. As illustrated in FIG. 3, a semi-rigid cable 110 includes a slot 150 that extends at least approximately halfway into a center conductor 120. In other embodiments, the slot 150 may extend less than—or more than—halfway, e.g., a third of the way, into the center conductor 120. Following a nickel (Ni) barrier and thick gold (Au) plating, for example, the Schottky diodes can be directly bonded to this "coplanar waveguide" with only insignificant interruptions to the environment of the semi-rigid coaxial cable 110. In other embodiments a material such as nickel-gold is applied to, for example, plated, within the slots, to provide an electrical mounting surface for the diodes. Another bonding method could include using conductive epoxy to mount the ESD device.

Forming the slot 150 introduces a highly localized inductive peaking of the cable 110 at the region of the slot. For ESD purposes, the slot 150 is sized so that when the Schottky diodes are mounted across the pseudo co-planer waveguide in the slot, the diode capacitance exactly balances the inductance peaking in the cable 110 caused by the slot. Therefore, this compensates for the inductance peaking caused by the formation of the slot 150, and maintains smooth signal transmission characteristics of the cable 110.

More details of the formation of the slot 150 may be found in U.S. patent application Ser. No. 13/713,220, published as US 2013/0285770, which is incorporated by reference herein.

As illustrated in FIG. 3, embodiments of the invention include a second slot 160 formed in the cable 110. The second slot 160 can accommodate additional components, such as another pair of Schottky diodes, in the same manner as illustrated in the first slot 150 of FIG. 2. The second slot 160 is spaced away from the first slot 150 by 40-300 mils, or more, and preferably by at least approximately 60 mils. The spacing ensures that the slots do not interfere with one another in the measuring circuit. In the embodiment where Shottky diodes fill the slots, it may be preferable to space the slots by at least 200 mils. If instead the second slot 160 is immediately adjacent the first slot 150, i.e., effectively widening the first slot 150 to accommodate the additional components for the slot 160, performance of the cable 110 suffers. This lowered performance is due to the resonance and power dissipation of the wide slot in the cable 110. Since the fundamental mode of the cavity resonance is inversely proportional to the largest physical dimension of the slot cavity, having a large slot size negatively affects the cable performance. A wide slot causes the slot resonance frequency to lower so much that it may interfere with in-band measurement in a test system.

Therefore, embodiments of the invention include a modular cable slot design. In embodiments of the invention, two or more slots 150, 160 are formed in the cable 110. First, the size and characteristics of a single slot is optimized for accommodating components to be mounted within the slot. For example a first slot including ESD protecting diodes is optimized where the cavity resonant frequency of the slot cavity is over a desired frequency, for example 26-50 GHz. In one embodiment the optimized slot is between 10-60 mils wide, and preferably between 40-60 mils wide. In one embodiment, the slots may be cut approximately 43 mils deep into the cable 110, which has a diameter of approximately 86 mils. For other size cables, the slot sizes and spacing between them are accordingly scaled.

Next, after the slot size of the first slot is optimized, if more components are desired to be put in the cable 110 than can fit within a single slot, or that can be optimized to fit within a single slot, then additional slots may be formed, provided they are separated apart from one another by a given distance. For example, if the ESD shunting capacity of Schottky diodes is too low, and more diodes are needed for adequate ESD protection, then the second slot may be formed to accommodate the additional Schottkey diodes. This allows a single slot design to accommodate various levels of desired ESD protection. In some embodiments three, four, or more slots may be used to accommodate additional components, in which each slot is spaced apart from one another. Including Schottky diodes within the slots increases protection from ESD events because each of the diodes in the different slots are in effect parallel to each other, and thus can share the total shunt current caused by the ESD event.

Spacing each optimized slot at least approximately 40 mils or more from its nearest adjacent slot minimizes any negative effects that creating the slots causes. Further, spacing the slots far enough apart that they do not interfere with one another provides the designer with a modularized component mounting system where additional components may be added without having to individually optimize each different slot.

Figure 4:
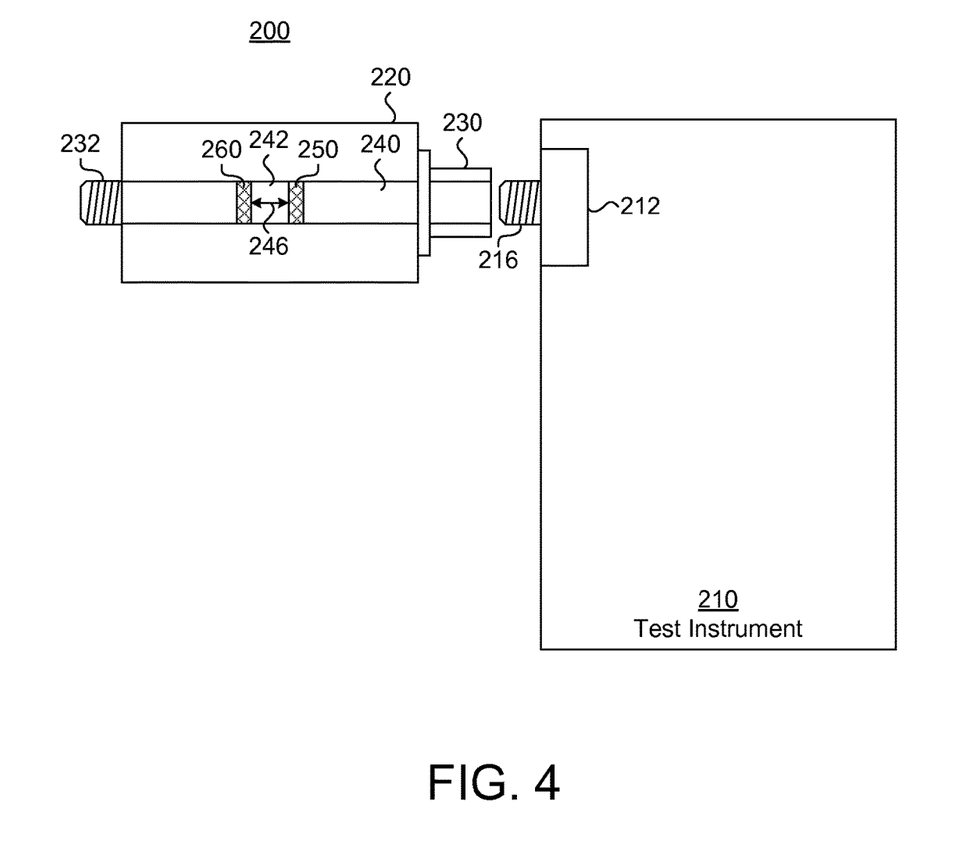
FIG. 4 is a block diagram illustrating components of an ESD protection system according to embodiments of the invention.

FIG. 4 is a block diagram illustrating an ESD device 200 according to embodiments of the invention coupled to and providing ESD protection for a test instrument 210. The ESD device 200 includes a housing 220, which may be formed of any suitable material. In one embodiment the housing 220 is formed of two aluminum half-shells with cavities. A connector 230 of the ESD device couples the ESD device to the test instrument 210. More specifically, the connector 230 may be a high frequency connector, such as a 2.92 mm RF connector (type "K" connector), that is coupled to a mating connector 216 of a sampling head 212 of the instrument 210. A connector 232 at the opposite end of the ESD device couples to a cable that is further connected to a probe or DUT, for example.

Within the ESD device 200 is a cable section 240, which may be, for example 1 to 2 inches long. Slots 250 and 260 are formed in the cable section 240, as described above, and include Schottky diodes for ESD protection, also as described above. The number of slots may be chosen based on the amount of ESD protection is desired by the ESD device 200. The slots 250, 260 are spaced from one another by a sub-section 242 of the cable 240 that has no slots. A distance 246 between the slots 250 and 260 may be at least 40 mils apart, as described above. Additional slots, spaced away from one another may also be formed in the cable section 240 to accommodate additional diodes.

Figure 5:
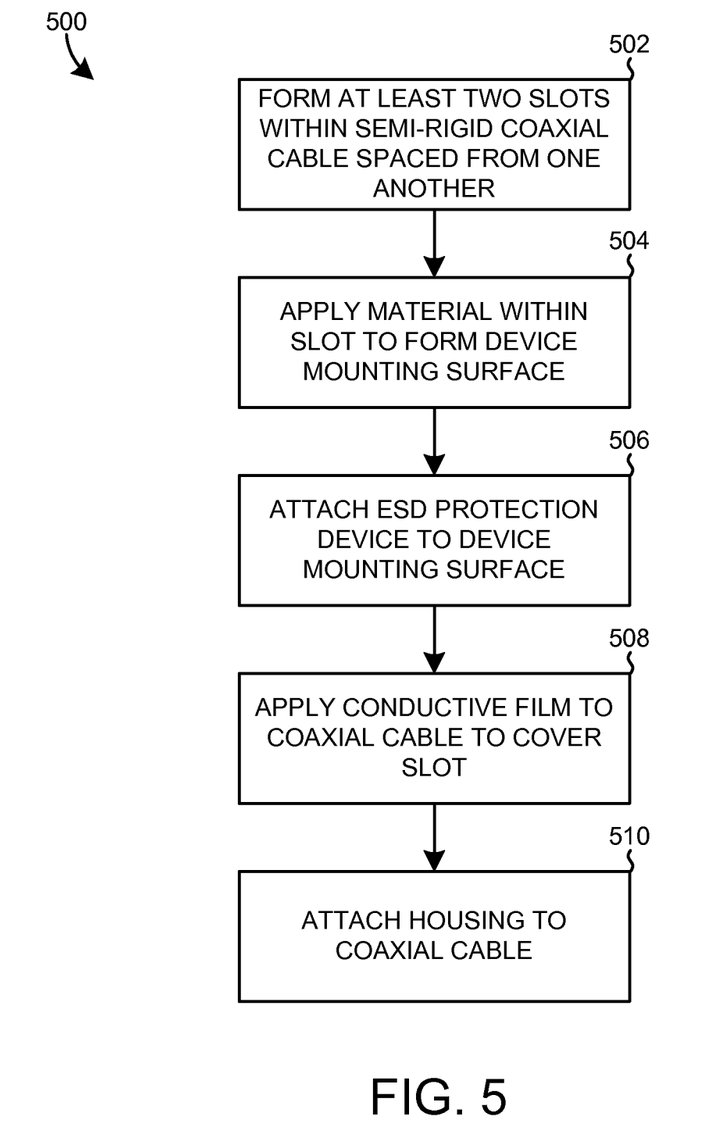
FIG. 5 is a flow diagram illustrating an example method of constructing the grooved coaxial cable including ESD protection according to embodiments of the invention.

FIG. 5 is a flowchart illustrating an example method 500 for producing an ESD apparatus in accordance with certain embodiments of the disclosed technology. At 502, two or more slots are formed in a spaced-apart relationship within a semi-rigid coaxial cable. The slots may be formed by standard milling methods using a high-speed cutter or a fine diameter diamond blade, for example. In some embodiments the slots are spaced from each other by at least 40 mils.

At 504, a material may be optionally applied within the slot so as to form a device mounting surface. The material may be gold, for example, and the attachment method may be made by thermalsonic bonding of the beam lead device, or use of an epoxy. At 506, a protection device, e.g., an ESD diode may be attached to the device mounting surface. At 508, a conductive foil such as gold, copper, or nickel, may be wrapped around the outside surface of the cable such that the film substantially or completely covers the slot itself or the outward-facing surface of the material applied at 504.

At 510, a housing may be attached to or otherwise coupled with the cable so as to cover the slot and conductive film. This housing may include a single piece or multiple portions that may be formed so as to interlock with each other, for example.

As described above, embodiments of the invention include a modularized signal conditioning apparatus system. The signal conditioning system includes a coaxial cable having a center conductor, an insulating material covering the center conductor, and having a ground shell covering the insulating material. The center conductor and the ground shell are electrically conductive. Within the coaxial cable is formed a first slot including a circuit component. The first slot is properly sized for and has electrical characteristics optimized to provide a predetermined signal conditioning effect on one or more signals carried through the coaxial cable. The electrical characteristics may include selecting which components to place within the slot. Embodiments also include a second slot formed in the coaxial cable at least 40 mils from the first slot.

The second slot may also be optimized to provide a second predetermined signal conditioning effect on the one or more signals carried through the coaxial cable. For instance a first component or components may be selected to be placed in the first slot to produce a first predetermined signal conditioning effect and a second component or components may be selected to be placed in the second slot to produce a second predetermined signal conditioning effect. The components may include resistors, varistors, varactors or diodes, for example.

In other embodiments first slot includes a first type of component or components selected to be placed in the first slot to produce a first predetermined signal conditioning effect and the second slot is a duplicate of the first slot.

In these or other embodiments the first slot may be electrically independent of the second slot.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

The invention claimed is:

1. An Electro-Static Discharge (ESP) device, comprising:
   a coaxial cable having a center conductor, an insulating material covering the center conductor, and having a ground shell covering the insulating material, in which the center conductor and the ground shell are electrically conductive;
   a first slot including a circuit component, the first slot having a size and electrical characteristics optimized to provide a predetermined signal conditioning effect on one or more signals carried through the coaxial cable, the circuit component including two Schottky diodes that are each electrically coupled between the center conductor and the ground shell;
   a second slot formed in the coaxial cable at least 40 mils from the first slot;
   a first connector;
   a second connector;
   a conductive film covering the first slot and the second slot; and
   a housing covering the conductive film.

2. The ESD device of claim 1 in which the second slot is optimized to provide a second predetermined signal conditioning effect on the one or more signals carried through the coaxial cable.

3. The ESD device of claim 2 in which the first slot comprises a first type of component and in which the second slot comprises a second type of component.

4. The ESD device of claim 2 in which the first slot is electrically independent of the second slot.

5. The ESD device of claim 2 in which the second slot is a duplicate of the first slot.

6. The ESD device of claim 5 in which the second slot comprises two Schottky diodes.

7. The ESD device of claim 1, further comprising a material applied within the slots to form a device mounting surface.

8. The ESD device of claim 1, in which the material comprises nickel-gold.

9. The ESD device of claim 1, in which the material is applied by way of a plating operation.

10. The ESD device of claim 1, wherein the coaxial cable is at least semi-rigid.

11. The ESD device of claim 1, wherein the conductive film includes gold, copper, or nickel.

12. The ESD device of claim 1, wherein the housing is formed of two half-shells having cavities.

13. The ESD device of claim 12, wherein the two half-shells are made of aluminum.

14. A method of forming an Electro-Static Discharge (ESD) protection circuit comprising:
   forming a first slot within a coaxial cable, the first slot extending to and exposing a portion of a conductive core of the coaxial cable, wherein the forming a first slot comprises cutting into the coaxial cable with a cutter;
   forming a second slot within the coaxial cable and spaced at least 40 mils from the first slot, the second slot extending to and exposing a portion of the conductive core of the coaxial cable;
   forming a first ESD protection structure within the first slot;
   forming a second ESD protection structure within the second slot;
   applying a conductive film around the coaxial cable to cover the first slot and the second slot; and
   attaching a housing to the coaxial cable to cover the conductive film.

15. The method of forming an Electro-Static Discharge (ESD) protection circuit of claim 14 wherein forming a first slot within a coaxial cable comprises forming a slot between 40-60 mils wide.

16. The method of forming an Electro-Static Discharge (ESD) protection circuit of claim 14 wherein forming a second slot within the coaxial cable and spaced at least 40 mils from the first slot comprises forming a second slot within the coaxial cable and spaced at least 100 mils from the first slot.

17. The method of forming an Electro-Static Discharge (ESD) protection circuit of claim 14 wherein applying a conductive film comprises applying a conductive film of nickel, gold, or copper.

18. The method of forming an Electro-Static Discharge (ESD) protection circuit of claim 14 in which forming a first ESD protection structure within the first slot comprises forming a sub-circuit including:
   inserting a first diode between the conductive core and a ground shell of the coaxial cable; and
   inserting a second diode between the conductive core and a ground shell of the coaxial cable.

* * * * *

UNITED STATES PATENT AND TRADEMARK OFFICE
CERTIFICATE OF CORRECTION

PATENT NO. : 9,601,444 B2
APPLICATION NO. : 14/317248
DATED : March 21, 2017
INVENTOR(S) : Kei-Wean C. Yang It is certified that error appears in the above-identified patent and that said Letters Patent is hereby corrected as shown below:

In the Claims

In Column 5, Line 37, Claim 1, replace "Electro-Static Discharge (ESP)" with "Electro-Static Discharge (ESD)"

Signed and Sealed this
Ninth Day of May, 2017

Michelle K. Lee
*Director of the United States Patent and Trademark Office*